United States Patent [19]
Williamson, III

[11] Patent Number: 5,371,803
[45] Date of Patent: Dec. 6, 1994

[54] TONE REDUCTION CIRCUIT FOR HEADSETS

[75] Inventor: William A. Williamson, III, Stone Mountain, Ga.

[73] Assignee: BellSouth Corporation, Atlanta, Ga.

[21] Appl. No.: 864,671

[22] Filed: Apr. 7, 1992

Related U.S. Application Data

[63] Continuation-in-part of Ser. No. 576,662, Aug. 31, 1990.

[51] Int. Cl.$^5$ .................... H04R 1/00; H03G 5/00; H03G 9/00; H03G 3/00
[52] U.S. Cl. ........................ 381/104; 381/74; 381/98; 381/102; 381/101
[58] Field of Search ............... 381/72, 74, 104, 106, 381/107, 108, 93, 94, 98, 102, 83, 110, 25

[56] References Cited

U.S. PATENT DOCUMENTS

| | | |
|---|---|---|
| 3,631,365 | 12/1971 | Dolby . |
| 3,751,602 | 8/1973 | Breeden . |
| 3,967,064 | 6/1976 | Sigworth .................. 381/94 |
| 4,079,211 | 3/1978 | Janssen . |
| 4,185,168 | 1/1980 | Granpe et al. .............. 387/94 |
| 4,224,470 | 9/1980 | Persson et al. . |
| 4,301,330 | 11/1981 | Trump . |
| 4,430,759 | 2/1984 | Ishigaki . |
| 4,449,106 | 5/1984 | Ishigaki et al. ............ 381/106 |
| 4,453,258 | 6/1984 | Richardson . |
| 4,457,020 | 6/1984 | King . |
| 4,538,926 | 8/1985 | Short et al. . |
| 4,587,561 | 5/1986 | Kudo . |
| 4,602,337 | 7/1986 | Cox ...................... 381/83 |
| 4,754,486 | 6/1988 | Stanfford et al. ........... 381/110 |
| 4,783,819 | 11/1988 | De Koning et al. .......... 381/93 |
| 4,835,484 | 5/1989 | Coulmance . |
| 4,962,426 | 10/1990 | Naoi . |
| 4,992,876 | 2/1991 | Nishizawa et al. . |

FOREIGN PATENT DOCUMENTS

| | | |
|---|---|---|
| 1228795 | 4/1971 | United Kingdom ............ 381/94 |
| 2189953 | 11/1987 | United Kingdom . |

Primary Examiner—James L. Dwyer
Assistant Examiner—Jack Chiang
Attorney, Agent, or Firm—Jones & Askew

[57] ABSTRACT

A tone reduction circuit for headsets designed to attenuate high frequency signals while permitting low frequency signals to pass undistorted. Input signal is supplied to a low-pass filter, a high-pass filter and an automatic gain control circuit (AGC). Outputs from both filters are input to a comparator, with the comparator output connected to the gain control input of the AGC. The AGC is configured to attenuate only the higher frequency signals. Thus, the comparator output controls gain imparted to the output signal produced by the AGC. The comparator output signals no gain in the automatic gain control circuit when low-pass filter output is greater than high-pass filter output, but when the high-pass filter output is greater than the low-pass filter output the comparator controls the automatic gain generator to attenuate the higher frequency input signal in proportion to the difference between high-pass filter output and low-pass filter output. Attenuation is further enhanced by having a low-pass filter with a shifting break point which is responsive to the comparator output. The low-pass filter break point is shifted down as the comparator output increases in amplitude, thereby further attenuating the input signal.

25 Claims, 2 Drawing Sheets

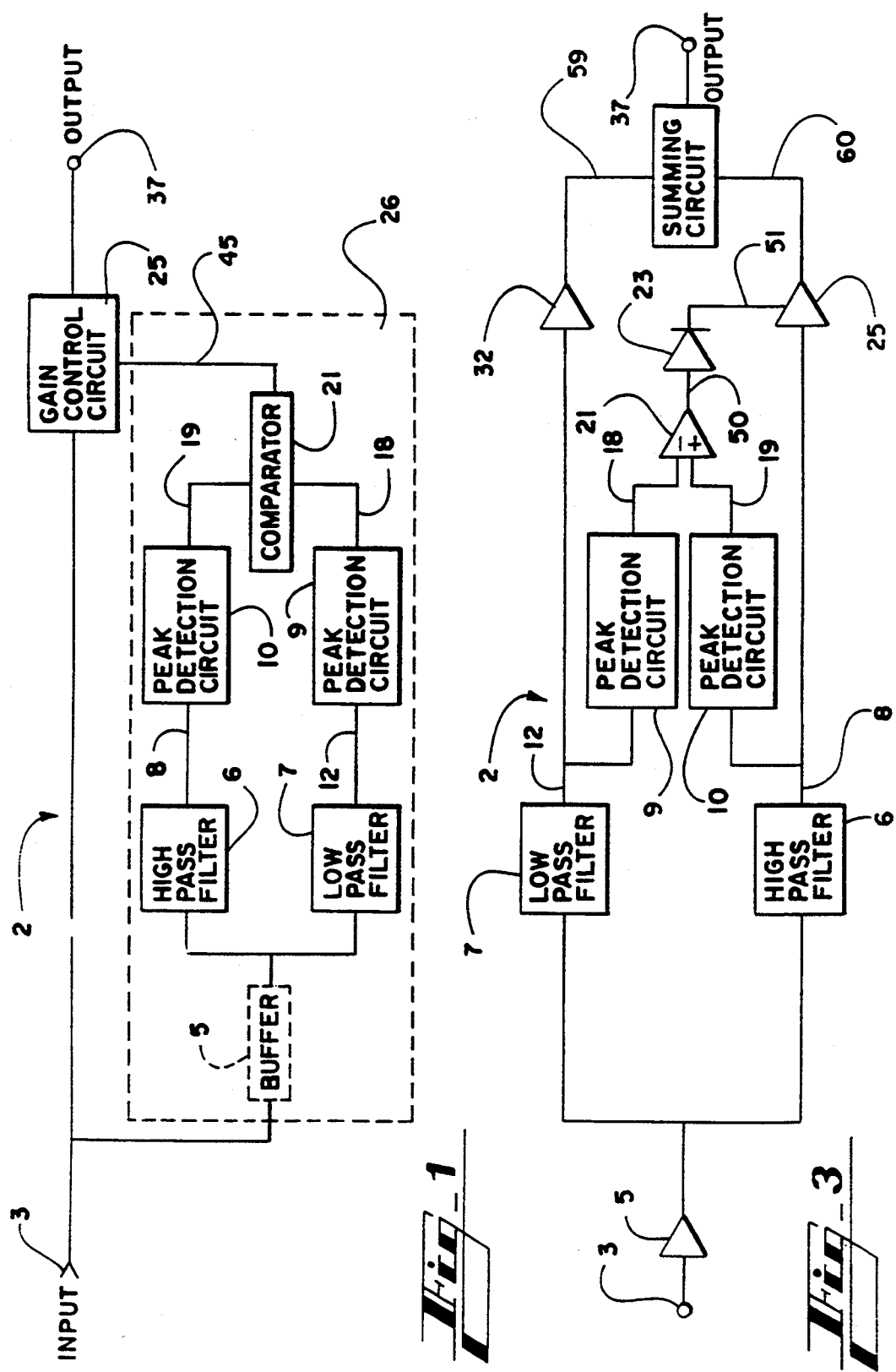

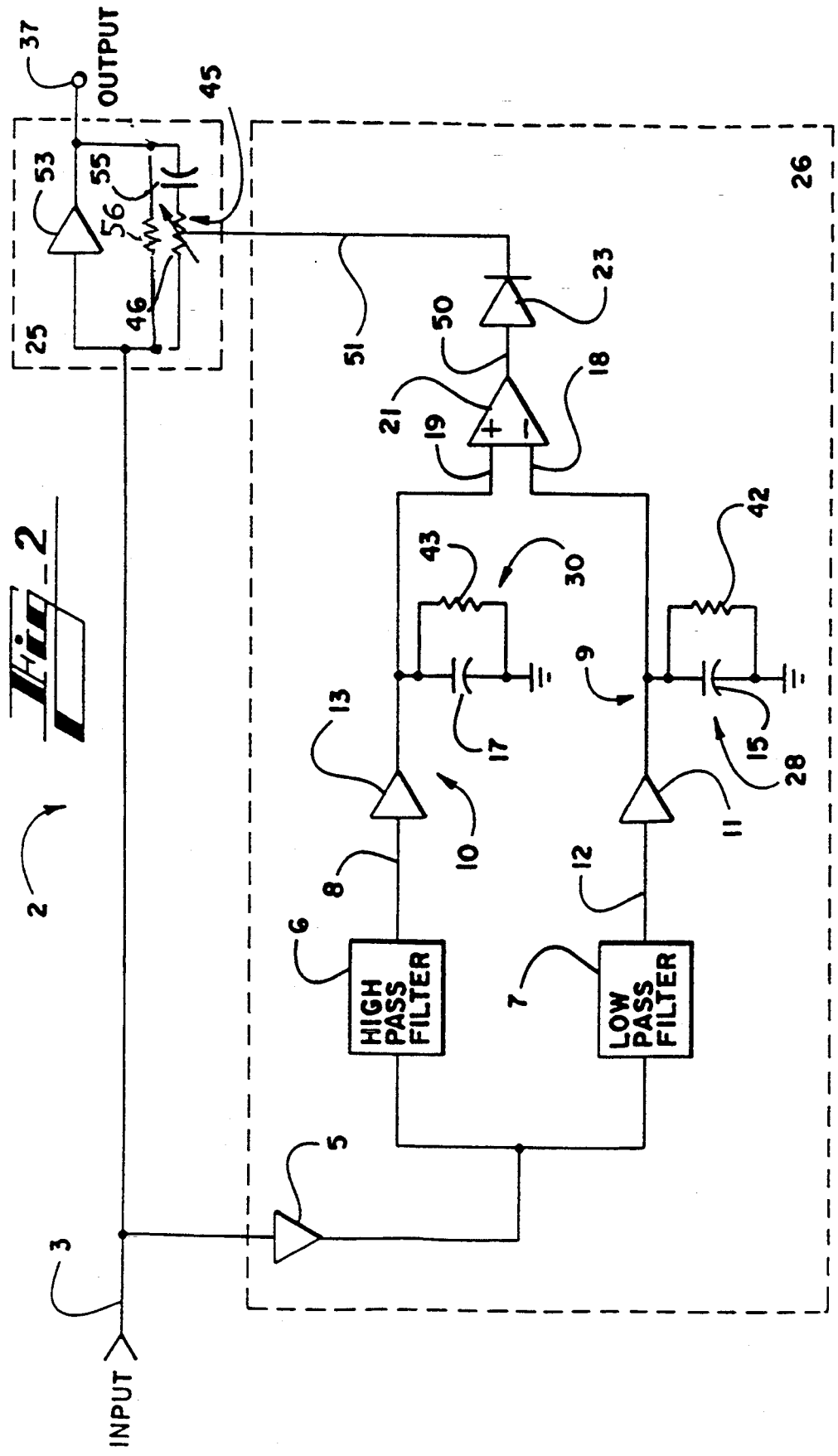

TONE REDUCTION CIRCUIT FOR HEADSETS

Cross Reference to Related Applications

This application is a continuation-in-part of U.S. application Ser. No. 576,662, filed Aug. 31, 1990, entitled "Improved Automatic Gain Control For A headset".

TECHNICAL FIELD

The present invention relates generally to apparatus for automatically varying the gain in an electronic circuit, and in particular discloses a high frequency tone reduction circuit for use with a telephone headset.

BACKGROUND OF THE INVENTION

Headsets have long been used in conjunction with modem telephone equipment. Typically, headset users are ones whose jobs require either that they spend a substantial amount of time on the phone, or that their hands be free to perform other tasks. Examples of occupations where headsets are commonly used, include, among others, telephone operators, office receptionists, airline reservation clerks, stock brokers, customer service representatives, and police and fire department dispatchers.

The use of a headset provides many advantages. For example, a headset allows the user to perform other tasks while on the telephone. Examples of such tasks include taking messages, routing incoming calls, and using a computer terminal to enter or retrieve data. The use of a headset also reduces the amount of time required to answer an incoming call, thus making the headset user more efficient. In addition, the use of a headset eliminates the physical discomfort that can occur when a person talking on the telephone attempts to prop a regular telephone handset against his or her ear by tilting the head and raising the shoulder.

However, there are also disadvantages associated with the use of headsets. Since the headset's transducer (i.e. a speaker) is held in or against the user's ear, it is impossible to respond to any irritating tones or noises by moving the transducer closer to, or further away from the ear as one typically does with a regular telephone handset.

For example, if a calling party activates the dual tone multi-frequency (DTMF) (tone dialing) keypad while his or her telephone station is connected to an operator wearing a headset, a tone signal as loud as—3 dBm to 0 dBrn can be generated on the telephone line at the operator's station. Often, aside from being annoyingly loud, such a tone is of a frequency that startles and annoys the headset wearer.

It is well known that excessive exposure to high-frequency noise causes fatigue and difficulty in concentration on one's work. This is particularly true if one experiences bursts of loud high-frequency noises, because human ears are most sensitive to frequencies in the range of 1–6 KHz. For voice grade telecommunications, high-frequency signals are defined to be in the range of 2–4 KHz. Thus, a reduction in exposure to high-frequency tones is desirable for both the comfort of employees wearing telephonic headsets and to prevent such employees from being unnecessarily fatigued and to meet the requirements of the Occupational Safety and Health Administration (OSHA).

There are existing headset control circuits which address the problem of loud sounds. One is a peak limiting circuit which suppresses extremely loud signals. A peak limiting device redtrees the level of signals which exceed a predetermined level. Only those signals (voice or noise) which are extremely loud are attenuated by a peak limiter. This type of device prevents the headset user from suffering discomfort or injury which could be caused by excessively loud signals. However, this approach does not attenuate the lower level but annoying and sometimes startling high-frequency signals. These circuits fail to attenuate high-frequency signals and pass lower frequency signals, the goal desired. Additionally, most limiting circuits are clipping devices and simply clip off the excursion of a signal past a particular threshold causing odd harmonic distortion which is known to have a harsh sound to the listener.

Conventional automatic gain control (AGC) works in a well known manner to make the gain at a given stage of amplification a function which is inversely proportional to the signal level at a given point in the circuit. Most conventional AGC circuits simply feed back the output of a particular stage to provide a control signal which reduces the gain as the output increases. In most application of AGC circuits to audio signal paths, the AGC is simply a form of negative feedback and is most commonly used to provide a non-linear (normally approximating logarithmic) signal level to gain characteristic.

As is well known to those skilled in the art, automatic gain control circuits are devices which almost always respond to some form of integrated or average signal level. Those which respond very quickly may be thought of as devices having very short integration times, and thus are circuits which average a very short time window of the signal level. Slower responding devices make the gain a function of the history of the signal over a longer, most recent interval, i.e., they have a longer integration time. Those skilled in the art know that it is common to define and describe two characteristics of automatic gain control known as attack and release time. The attack time is the time period required after a sudden increase in the input signal amplitude for the gain of the AGC circuit to reach a predetermined percentage of the steady state change in gain it will make in response to continued application of the new input signal level. Similarly, release time is defined as a similar interval for the change in amplification which results from a sudden decrease in input signal level. Those skilled in the art know that many AGC circuits are designed to achieve varying desired attack and release times without introducing an excessive amount of distortion into the audio signal. Unfortunately, AGC's typically do not have quick attack times, which permits short bursts of high-frequency tones to pass through before responsive attenuation can occur.

Also, the goal of AGC circuits is dynamic range compression. Range compression serves to reduce the amplitude difference in audio signal between the loudest and softest signals present in the signal path. Although AGC's compress audio signals, unexpected high-frequency tones still cause problems for headset wearers. Even lower amplitude high-frequency signals often cause discomfort. In summary, both peak limiting and AGC's circuits act over the whole frequency spectrum, and do not take into account the ears added sensitivity to the higher frequency signals. Thus, a fast attack attenuator which only responds to and reduces higher frequency tones is needed.

Currently, two methods for reducing the effects of high-frequency tones exist. First, a low-pass filter could be placed on input signals. This would attenuate all higher frequency inputs. However, as one would expect, desired voice signals are attenuated and, thus, intelligibility is reduced and the output is distorted. This method is not acceptable.

Second, "Dolby-type" frequency sensitive compressors have been used in the recorded sound arts. (U.S. Pat. No. 3,631,365). The well known Dolby compression and expander system for use in recorded audio provides amplitude sensitive filtering over specified segments of the audio band width. The most common Dolby system is "Dolby B", which is designed for use with home magnetic tape recording equipment. The Dolby compressor/expander system is one for which low level inputs signals have their high frequency content expanded. In other words the gain over the higher frequency portion of a band width of interest is increased in response to a low signal level. This expanded signal is recorded on tape.

On playback, detection of a low intensity signal causes a complimentary compression of the same high frequency band. This has the effect of attenuating the high frequency noise, or "tape hiss," inherent in the recording process, thereby reducing the perceived noise level. Dolby B system does not attenuate at any frequency in the presence of high intensity signals because the high level signal will mask the tape hiss. Thus, an expanded signal is recorded, but only when the input signals is at a relatively low level. This prevents expansion of relatively high level signals in a manner that would cause clipping or saturation during the recording process.

Thus, while Dolby teaches frequency selective attenuation to reduce perceived noise levels, it does so only in the context of a complimentary expander/compressor for use in recording and playing back audio signals.

Therefore, it can be seen that a need yet exists for a high- frequency tone attenuator for headsets, wherein the attenuation of high-frequency tones is relatively fast and minimum attenuation of low-frequency signals occurs. Further, the attenuation should occur only when high-frequency input energy exceeds low-frequency input energy.

SUMMARY OF THE INVENTION

The present invention provides an improved automatic tone attenuator for a headset. Generally described, the present invention employs a fast attack detector which attenuates the input audio signal when the high-frequency components of the input signal have greater energy than low-frequency components of the input signal.

In the attenuator of the present invention, the input audio signal is simultaneously connected to an automatic gain control circuit (AGC), a high-pass filter and a low-pass filter. Outputs from the high and low pass filters are separately passed through peak detection circuits. The high-frequency band peak signal and low-frequency band peak signal are then provided to a comparator, the output of which is used to control the gain of the AGC. It should be understood that the comparators used in the preferred embodiment of this invention are ones which function essentially as differential amplifiers, at least when the signal level at its positive input exceeds that at its negative input. Thus, the comparator provides an output signal proportional to the difference of the input voltages, at least for half of its output swing.

When the low-frequency band peak signal energy is greater than or equal to the high-frequency band peak signal energy, the comparator outputs a logical "0" to the AGC, and the input audio signal passes with unity gain through the AGC. Alternatively, when the high-frequency band peak signal energy is greater than the low-frequency band peak signal energy, the comparator produces an output signal with a voltage amplitude proportional to the difference between the high-frequency band peak signal energy and the low-frequency band peak signal energy. In other words, when high-band peak signal energy is greater than low-band peak signal energy, the comparator output voltage is proportional to the ratio of low-band peak signal energy to high-band peak signal energy.

Upon receiving the comparator output signal the AGC increases the attenuation in proportion to the comparator output voltage level. As the comparator output voltage level increases (resulting from higher levels of energy in the high-frequency band), attenuation of the input audio signal increases. As the comparator output voltage level decreases (resulting from lower levels of energy in the high-frequency band), attenuation of the input audio signal decreases. Viewed another way, the signal path gain decreases as the ratio of high frequency energy/low frequency energy in the input signal increases beyond unity.

Because of the quick response of the filters, the comparator, and the AGC, the attack time of the tone attenuator is very fast. Therefore, when a high-frequency tone is encountered, attenuation begins almost instantaneously. Additionally, release times of the tone attenuator are very fast. This, attenuation stops quickly after the high frequency signal stops and attenuation of lower frequency signals is minimal.

Thus, it is an object of the present invention to provide an improved tone attenuator for a headset. It is a further object of the present invention to provide an improved tone attenuator with faster attack and release times than conventional AGC's.

It is a further object of the present invention to provide an improved tone attenuator particularly for use in telephone headsets which requires no complementary compressor/expander.

It is a further object of the present invention to provide an improved tone attenuator wherein attenuation level is determined by the relative energy in the high-frequency and low-frequency components of an input audio signal.

It is a further object of the present invention to provide a tone attenuator which attenuates all high-frequency tones, regardless of amplitude, so long as the high-frequency energy predominates the input audio signal.

It is a further object of the present invention to provide an improved tone attenuator wherein attenuation of high-frequency signals occurs but intelligibility of the audio signal is maintained.

Other objects, features and advantages of the present invention will become apparent to those skilled in the art upon reading the following specification when taken in conjunction with the drawings and the appended claims.

BRIEF DESCRIPTION OF THE DRAWINGS

FIG. 1 is a block diagram of the preferred embodiment of an automatic tone attenuator for a headset in accordance with the present invention.

FIG. 2 is a schematic of the preferred embodiment of an automatic tone attenuator for a headset in accordance with the present invention.

FIG. 3 is a block diagram of another embodiment of an automatic tone attenuator for a headset in accordance with the present invention.

DETAILED DESCRIPTION OF THE DISCLOSED EMBODIMENT

Turning next to the drawings in which like referenced numerals represent like parts, the preferred embodiment will now be described in detail.

FIG. 1 discloses an automatic tone attenuator for a headset in accordance with the present invention. The tone attenuator 2 automatically attenuates high-frequency tones input to a telephone headset. In its preferred form, the present invention includes an audio signal input terminal 3, a tone discriminator 26, an AGC 25 and an audio signal output terminal 37. As described below, the AGC 25 is used to attenuate the audio signal on input 3 before delivering it to output 37. The tone discriminator 26 controls the AGC 25 which in turn controls the degree of attenuation which is applied to the audio signal on input 3.

As shown in FIG. 1, the tone discriminator 26 comprises a buffer amplifier 5, high pass filter 6, low pass filter 7, high band peak detector 10, low band peak detector 9, and comparator (differential amplifier) 21. The audio signal at input 3 is first received in tone discriminator 26 by buffer amplifier 5. Such an input buffer stage for receiving incoming signals from the phone system is well known in the art. The output of the buffer amplifier 5 is connected to the high-pass filter 6 and the low-pass filter 7.

The high-pass filter 6 is designed with a cut-off frequency so that it passes tones above a frequency in the range of 1–1.5 kHz. (Experimentation will determine the optimum cut-off frequency within that range.) The high-pass filter 6 thus serves to separate higher frequencies, including annoying tones, from the audio signal from input 3. Many high-pass filters well known to those skilled in the art would serve admirably (for example, a Butterworth or Chebychev filter). The signal at high-pass filter output 8, therefore, is the high-frequency band component of the input audio signal from input 3. The high-frequency band component ranges from the selected cut-off frequency of the high-pass filter (1–1.5 kHz) up to the cut-off frequency of the telephone company's lines (about 3.5 kHz).

The low-pass filter 7 is designed to have the same cutoff frequency as high-pass filter 6 so that it passes tones below a frequency in the range of 1–1.5 kHz. Many low-pass filters well known to those skilled in the art would serve admirably (for example, a Butterworth or Chebychev filter). The signal at low-pass filter output 12, therefore, is the low-frequency band component of the input audio signal from input 3. The low-frequency band component includes frequencies below the selected cut-off frequency of the low-pass filter (1–1.5 kHz). Thus, the input audio signal is split, with the low-frequency band component available at the low-pass filter output 12 and the high-frequency band component available at the high-pass filter output 8.

As FIG. 2 shows, the high-frequency band component on output 8 is connected to a full-wave rectifier 13, and the low-frequency band component on output 12 is connected to a full wave rectifier 11. The outputs of the full wave rectifiers 11 and 13 are connected to resistor and capacitor (R-C) circuits 28 and 30 respectively. R-C circuit 28 is for the low-frequency band and comprises capacitor 15 and resistor 42. R-C circuit 30 is for the high-frequency band and comprises capacitor 17 and resistor 43. Rectifiers 11 and 13 together with R-C circuits 28 and 30 form peak detectors 9 and 10 respectively. As is well known to those skilled in the art, R-C circuits 28 and 30 will capture and hold the peaks of the low-frequency band signal and the high-frequency band signal respectively. Consequently, the outputs 18 and 19 of the R-C circuits 28 and 30 follow the voltage peaks of the rectified low-frequency band component and high frequency band component, respectively, of audio signal input 3.

In producing the high-frequency band peak signal 19, the attack time for the peak detector 10 should be as short as possible. The attack time is the time it takes for capacitor 17 to charge through the low output impedance of the full wave rectifier 13 to a voltage equal to the signal at the output of rectifier 13. Preliminary efforts indicate attack times for peak detector 10 of 0.2 milliseconds (ms) are feasible. The release time is established by the time constant of the R-C circuit 30. The release time is slower than the attack time, but is still fast relative to normal AGCs. Release times around 100 ms are presently anticipated, although further experimentation might prove other values to be more appropriate. As is known in the art, the values of resistor 43, capacitor 17 and the output impedance of the rectifier 13 establishes the attack and release times. Likewise, the attack and release times for the low-frequency peak detector 9 are controlled by the values of capacitor 15, resistor 42 and the output impedance of the rectifier 11.

High-frequency band peak signal 19 is input to the positive terminal of a comparator differential amplifier 21. Low frequency band peak signal 18 is input to the negative terminal of comparator 21. Thus, the comparator output 50 will be positive when The high-frequency band peak signal energy (on input 19) exceeds the low-frequency band peak signal energy (on input 18), and negative when the low-frequency band peak signal energy (on input 18) exceeds the high-frequency band peak signal energy (on input 19). Also, the amplitude of comparator output 50 is directly related to the amplitude difference between the two input signals on inputs 19 and 18.

Diode 23 is responsive to comparator output 50. Diode 23 functions as a switch, turning off when comparator output 50 is a negative voltage and turning on when comparator output 50 is a positive voltage. As a result, the output 51 from diode 23 is 'O' when low-frequency band peak signal 18 is greater than high-frequency band peak signal 19, and comparator output signal 50 passes unchanged through diode 23 when high-frequency band peak signal 19 is greater than low-frequency band peak signal 18.

As previously described, the AGC 25 is regulated by diode output 51. AGC 25 includes amplifier 53 with dynamic feedback circuit 45. The dynamic feedback circuit 45 comprises resistor 56 to set flat gain, voltage controlled variable resistor 46 (such as a MOSFET) to control high frequency attenuation, and high pass capacitor 55. Comparator output 50 is connected to the voltage controlled variable resistor 46 via diode 23 and diode output 51. As comparator output voltage on output 50 decreases, resistance across resistor 46 increases, and as comparator output voltage increases, resistance across resistor 46 decreases. When the voltage on line 51 from comparator 21 is equal to zero, the input audio signal on line 3 passes through AGC 25 at unity gain with a relatively flat frequency response. When the voltage on line 51 from comparator 21 rises above zero, the gain of the AGC decreases for high frequency signals and the higher frequency input audio signals on line 3 are attenuated. Therefore, if the high-frequency energy in the input audio signal on line 3 exceeds the low-frequency energy in the input audio signal, comparator 21 causes AGC 25 to decrease its gain, and the AGC 25 attenuates the higher frequency input signal on line 3 to produce an attenuated output signal on line 37. Alternatively, if the low-frequency energy in the input audio signal on line 3 is equal to or exceeds the high-frequency energy in the input audio signal, comparator 21 controls AGC 25 to produce a unity gain at all frequencies, and the input signal on line 3 passes unattenuated to the output line 37. High-frequency signals are thus attenuated while signals with strong low-frequency components pass unattenuated.

The effect of this should be considered for a moment. The gain of gain control circuit 25 is controlled by the ratio of the feedback impedance to an input of impedance (not shown). Upon inspection of FIG. 2, it will be appreciated that the feedback impedance in the preferred embodiment takes the form $R_{56}(R_{46}sC+1)/(sC(R_{46}+R_{56})+1)$, where $R_{46}$ and $R_{56}$ are the resistances of resistors 46 and 56, respectively, and s is the Laplace transform variable. C is the value of capacitor 55 in the feedback loop. Since the gain of gain control circuit 25 is proportional to this feedback impedance, it will be appreciated that the equation for impedance may be viewed as the transfer function for the gain control circuit in the preferred embodiment. This transfer function is a single pole low-pass filter. The location of the pole, and thus the break point of the filter, is determined by the value of capacitor 55 and the sum of resistors 46 and 56. Since the value of resistor 46 changes in response to the ratio of the signal energy in the two specified bands defined by high pass filter 6 and low pass filter 7, it will be appreciated that the break point of the transfer function moves in response to this ratio, because the ratio controls the value of resistor 46. As the value of the resistor 46 decreases, the break point moves down and thus occurs at a lower frequency than it does when the value of resistor 46 is relatively high. This being the case, an increase in the ratio of high frequency energy to low frequency energy in the input signal not only causes a reduction in the gain of gain control circuit 25, but moves the break point to a lower frequency thereby further enhancing the attenuation of high frequency signals.

For a somewhat more intuitive approach, it will be appreciated that an increase in the ratio of high frequency energy to low frequency energy has an audio effect that is analogous to both turning down the volume and turning down a treble control on a piece of home audio equipment.

Because the attack and release times are so rapid, comparator 21 continuously and almost instantaneously sends a control signal to the AGC 25 representative of whether the high-frequency or the low-frequency band of the input audio signal 3 possesses greater energy. Therefore, unlike most AGCs which integrate the input signal over time in order to determine if gain or attenuation is required, the automatic tone attenuator of Applicant's invention controls attenuation almost instantly.

As is obvious to one skilled in the art, an electronic tone control circuit, automatic gain control circuit or any other voltage controlled gain circuit could be used to implement the attenuation function.

FIG. 3 shows a block diagram of another embodiment of the present invention. Input audio signal 3 passes through buffer 5 and is supplied to a high-pass filter 6 and low-pass filter 7. Filters 6 and 7 operate as previously described.

The high-frequency band component on output 8 is connected to a high-band peak detection circuit 10, and the low-frequency band component on output 12 is connected to a lowband peak detection circuit 9. As previously described, peak detectors 9 and 10 are comprised of full wave rectifiers in series with R-C circuits (not shown in this embodiment). Attack and release times for peak detectors 9 and 10 of FIG. 3 are the same as for peak detectors 9 and 10, respectively, discussed above.

Outputs 18 and 19 from peak detection circuits 9 and 10, respectively, are input to a comparator (differential amplifier) 21. High-frequency band peak signal 19 is input to the positive terminal of a comparator 21, and low-frequency band peak signal 18 is input to the negative terminal of comparator 21. Comparator output 50 thus represents the difference between high-frequency band peak signal 19 and low-frequency band peak signal 18.

Diode 23 is responsive to comparator output 50. Diode 23 functions as a switch, turning off when comparator output 50 is a negative voltage and turning on when comparator output 50 is a positive voltage. Thus, the output of comparator 21 is O when low-frequency band peak signal 18 is greater than the energy in high-frequency band peak signal 19, and is a positive voltage corresponding to the energy difference between high-frequency band peak signal 19 and low-frequency band peak signal 18 when the energy in high-frequency band peak signal 19 exceeds the energy in low-frequency band peak signal 18.

Automatic gain control circuit 25 is supplied with the diode output 51. The operation of AGC 25 was described earlier. The input to AGC 25 is high-pass filter output 8. Thus, attenuation of rectified high-pass filter output 8 occurs when the high-frequency band signal 19 energy is greater than the low-frequency band peak signal 18 energy. When low-frequency band peak signal 18 exceeds or is equal to high, band peak signal 19, unity gain is imparted by AGC 25 to rectified high-pass filter output 8.

High-pass filter output 8 is thus attenuated by AGC 25. Low-frequency component 12 of the input audio signal 3 is passed through unity gain amplifier 32. Outputs 60 and 59 from AGC 25 and unity gain amplifier 32, respectively, are input to a summer 35 which adds the signals. Therefore, the original input signal on input 3 is recreated on output line 37, except that the high-frequency band signal 8 is attenuated when high-frequency band energy exceeds low-frequency band energy in the input signal.

An electronic tone control circuit, automatic gain control circuit or any other voltage controlled gain circuit could be used to implement the attenuation function.

From the foregoing, it will be appreciated that the preferred embodiment of the present invention overcomes the drawbacks of the prior art described hereinabove and accomplishes the previously stated objects of the present invention. From the description of the preferred embodiment equivalents of the elements shown therein will suggest themselves to those skilled in the art and ways of constructing other embodiments of the present invention will suggest themselves to practitioners of the art. Therefore, the scope of the present invention is to be limited only by the claims below.

What is claimed is:

1. An improved high-frequency tone attenuator for headsets, comprising:
   an input stage for accepting an audio signal;
   a gain control circuit supplied with said audio signal, for attenuating said audio signal;
   a control input to said gain control circuit, for controlling the attenuation level applied by said gain control circuit to said audio signal;
   low-pass filter supplied with said audio signal, for producing a low-frequency band component of said audio signal;
   high-pass filter supplied with said audio signal, for producing a high-frequency band component of said audio signal;
   first and second peak detection means for producing a low-frequency band peak signal and a high-frequency band peak signal in response to said low-frequency band component and said high-frequency band component, respectively;
   comparator means, responsive to said high-frequency band peak signal and said low-frequency band peak signal for providing a comparator output signal having a first value when said high-frequency band peak signal is less than said low-frequency band peak signal and otherwise having a positive voltage output with the amplitude of said comparator output representing the difference between the amplitude of said high-frequency band peak signal and said low-frequency band peak signal; and
   said control input on said gain control circuit being connected to said comparator output, and causing the gain control circuit to attenuate said audio signal in response to said comparator output.

2. The high-frequency tone attenuator of claim 1 wherein said gain control circuit includes a low-pass filter that has a shifting break point, said shifting break point being controlled by said control input so that said break point shifts to lower frequencies when said control input has higher amplitude than when said control input has a lower amplitude.

3. The gain control circuit of claim 2 wherein said low-pass filter in said gain control circuit comprises a capacitor and a first resistor both in parallel with a second resistor, said first resistor having variable resistance, said variable resistance being controlled by said control input.

4. The high-frequency tone attenuator of claim 1 wherein said low-pass filter and said high-pass filter have the same cut-off frequency.

5. The high-frequency tone attenuator of claim 2 wherein said cut-off frequency is between 1–1.5 kHz.

6. The high-frequency tone attenuator of claim 1 wherein said comparator is a differential amplifier.

7. The high-frequency tone attenuator of claim 1 wherein said gain control circuit is an automatic gain control circuit which is controlled by the voltage level of said comparator output.

8. The high-frequency tone attenuator of claim 1 wherein each said peak detection means comprises:
   two full-wave rectifiers, one connected to the output of each said low-pass and high-pass filters;
   a filter capacitor connected to the output of each said full-wave rectifier and to a ground; and
   a resistor connected to the output of each said full-wave rectifier and to a ground.

9. An improved high-frequency tone attenuator for headsets, comprising:
   an input stage for accepting an audio signal;
   low-pass filter supplied with said audio signal, for producing a low-frequency band component of said audio signal;
   high-pass filter supplied with said audio signal, for producing a high-frequency band component of said audio signal;
   gain control circuit supplied with said high-frequency band component of said audio signals, for attenuating said high-frequency band component;
   a control input to said gain control circuit for controlling the attenuation level applied by said variable gain circuit to said high-frequency band component of said audio signal;
   fixed gain amplifier supplied with said low-frequency band component of said audio signal;
   first and second peak detection means for producing a low-frequency band peak signal and a high-frequency band peak signal, responsive to said low-frequency band component and said high-frequency band component, respectively, of said audio signal;
   comparator means responsive to said high-frequency band peak signal and said low-frequency band peak signal for providing a comparator output signal having a first value when said high-frequency band peak signal is less than said low-frequency band peak signal and otherwise having a second value different from the first value;
   said control input on said gain control circuit being connected to said comparator output, and causing the gain control circuit to attenuate said high-frequency band component in response to said comparator output signal; and summing circuit, for adding the output from said gain control circuit to the output from said fixed gain amplifier.

10. The high-frequency tone attenuator of claim 9 wherein said gain control circuit includes a low-pass filter that has a shifting break point, said shifting break point being controlled by said control input so that said break point shifts to lower frequencies when said control input has higher amplitude than when said control input has a lower amplitude.

11. The gain control circuit of claim 9 wherein said low-pass filter in said gain control circuit comprises a capacitor and a first resistor in parallel with a second resistor, said first resistor having variable resistance, said variable resistance being controlled by said control input.

12. The high-frequency tone attenuator of claim 9 wherein said low-pass filter and high-pass filter have the same cut-off frequency.

13. The high-frequency tone attenuator of claim 12 wherein said cut-off frequency is between 1–1.5 kHz.

14. The high-frequency tone attenuator of claim 9 wherein said comparator is a differential amplifier.

15. The high-frequency tone attenuator of claim 9 wherein said gain control circuit is an automatic gain control circuit which is controlled by the voltage level of said comparator output.

16. The high-frequency tone attenuator of claim 9 wherein each said peak detection means comprises:
- two full-wave rectifiers, one connected to the output of each said low-pass and high-pass filters;
- a filter capacitor connected to the output of each said full-wave rectifier and to ground; and
- a resistor connected to the output of each said full-wave rectifier and to ground.

17. An improved high-frequency tone attenuator for headsets, comprising:
- an input stage for accepting an audio signal;
- low-pass filter supplied with said audio signal for producing a low-frequency band component of said audio signal;
- high-pass filter supplied with said audio signal, for producing a high-frequency band component of said audio signal;
- first and second peak detection means for producing a low-frequency band peak signal and a high-frequency band peak signal in response to said low-frequency band component and said high-frequency band component respectively, of said audio signal;
- comparator means, responsive to said high-frequency band peak signal and said low-frequency band peak signal for providing a comparator output signal having a first voltage when said high-frequency band peak signal is less than said low-frequency band peak signal and otherwise having a positive voltage output with the amplitude of said comparator output representing the difference between the amplitude of said high-frequency band peak signal and said low-frequency band peak signal;
- a gain control circuit, supplied with said high-frequency band component of said audio signal, for attenuating said signal input to said gain control circuit;
- a control input on said gain control circuit connected to said comparator output, causing the gain control circuit to attenuate signals input to said gain control circuit in response to said comparator output.

18. An improved high-frequency tone attenuator for headsets, comprising:
- an input stage connected to an audio signal;
- said input stage connected to the input of an automatic gain control device;
- a control input on said automatic gain control device, for controlling said automatic gain control device;
- a low-pass filter with a cut-off frequency between 1 and 1.5 kHz connected to said input stage for creating a low-frequency component off said input audio signal;
- a high-pass filter with a cut-off frequency between 1 and 1.5 kHz connected to said input stage for creating a high-frequency component of said input audio signal;
- a first full wave rectifier responsive to said low-pass filter output;
- a second full wave rectifier responsive to said high-pass filter output;
- a first capacitor connected to said first full wave rectifier output and also connected to ground, for creating a low-frequency band peak signal corresponding to said low-frequency component of said input audio signal;
- a second capacitor connected to said second full wave rectifier output and also connected to ground, for creating a high-frequency band peak signal corresponding to said high-frequency component of said input audio signal;
- a first resistor connected to said first full wave rectifier and also connected to ground, for allowing said first capacitor to have fast attack and release times;
- a second resistor connected to said second full wave rectifier and also connected to ground, for allowing said second capacitor to have fast attack and release times;
- a differential amplifier responsive at a positive input to said high-frequency band peak signal and responsive at a negative input to said low-frequency band peak signal;
- a diode responsive to said differential amplifier output, for providing a zero level output on said diode's output when said differential amplifier output is zero or negative, caused by energy in the low-frequency band peak signal exceeding energy in the high-frequency band peak signal; and
- said control input on said automatic gain control circuit responsive to said diode's output, for increasing attenuation applied to said input audio signal as said diode output increases.

19. An improved high-frequency tone attenuator for headsets, comprising:
- an input stage connected to the output of a modem for receiving an audio signal;
- a low-pass filter with a cut off frequency between 1 and 1.5 KHz connected to said input stage for creating a low-frequency band component of said input audio signal;
- a high-pass filter with a cutoff frequency between 1 and 1.5 KHz connected to said input stage for creating a high-frequency band component of said input audio signal;
- a first full wave rectifier responsive to said low-pass filter output;
- a second full wave rectifier responsive to said high-pass filter output;
- a first capacitor connected to said first full wave rectifier output and also connected to ground, for creating a low-frequency band peak signal corresponding to said low-frequency component of said input audio signal;
- a second capacitor connected to said second full wave rectifier output and also connected to ground, for creating a high-frequency band peak signal corresponding to said high-frequency component of said input audio signal;
- a first resistor connected to said first full wave rectifier and also connected to ground, for allowing said first capacitor to have fast attack and release times;
- a second resistor connected to said second full wave rectifier and also connected to ground, for allowing said second capacitor to have fast attack and release times;
- a differential amplifier responsive at a positive input to said high-frequency band peak signal and responsive at a negative input to said low-frequency band peak signal;
- a diode responsive to said differential amplifier output, for providing a zero level output on said diode's output when said differential amplifier output is zero or negative, caused by energy in the low-frequency band peak signal exceeding energy in the high-frequency band peak signal and otherwise producing an output corresponding to said differential amplifier output;

an automatic gain control device responsive to the output of said high-pass filter;

a control input: on said automatic gain control device, for controlling said automatic gain control device, responsive to said diodes output, for increasing attenuation applied to said input audio signal as said comparator output increases;

a fixed gain amplifier responsive to the output of said low-pass filter; and summing means responsive to said fixed gain amplifier output and responsive to said automatic gain control device output, for adding the outputs from said gain control circuit and said fixed gain amplifier.

20. An improved high-frequency tone attenuator for headsets, comprising:

an input for accepting an audio signal;

a gain control circuit connected to said input for attenuating said audio signal in response to a gain control signal applied to a control input to said gain control circuit, thereby providing an audio output signal;

a low pass filter connected to said input for producing a low-frequency band component of said audio signal;

a high pass filter connected to said input for producing a high-frequency band component of said audio signal;

peak detection means connected to said low pass filter and said high pass filter for producing a low-frequency peak signal in response to said low-frequency band component of said audio signal and a high-frequency peak signal in response to said high-frequency band component of said audio signal;

comparator means receiving said low-frequency peak signal and said high-frequency peak signal and outputting said gain control signal in response to said high-frequency peak signal and said low-frequency peak signal, said comparator means causing said gain control signal to have a predetermined value when said low-frequency peak signal exceeds said high-frequency peak signal by at least a predetermined threshold signal difference and otherwise to have a variable value that varies directly with the difference between said high-frequency peak signal and said low-frequency peak signal so as to cause said gain control circuit to increase attenuation of said audio signal as said difference between said high-frequency peak signal and said low-frequency peak signal increases.

21. A high-frequency tone attenuator for headsets as recited in claim 20 wherein:

said predetermined threshold signal difference is zero.

22. A high-frequency tone attenuator for headsets as recited in claim 20 wherein:

said gain control circuit includes a low pass filter that is connected to said control input and has a shifting break point, said shifting break point shifting to lower frequencies in response to said control input varying when said difference between said high frequency peak signal and said low frequency peak signal increases.

23. A high-frequency tone attenuator for headsets as recited in claim 20 wherein:

said variable value of said gain control signal varies linearly with said difference between said high frequency peak signal and said low frequency peak signal.

24. An improved high-frequency tone attenuator for headsets, comprising:

an input for accepting an audio signal;

filter and peak detection means connected to said input for providing a high-frequency peak signal and a low-frequency peak signal in response, respectively, to the high-frequency content and low-frequency content of said audio signal;

comparator means connected to said filter and peak detection means for providing a gain control signal in response to the difference between said high-frequency peak signal and said low-frequency peak signal, said gain control signal varying directly with said difference over at least a predetermined portion of a range of values of said difference; and a gain control circuit connected to said input and having a control input connected to said comparator means for causing attenuation of a variable bandwidth of a high-frequency portion of said audio signal in response to said gain control signal thereby providing an audio output signal, said gain control circuit being responsive to said gain control signal to increase said variable bandwidth of said high-frequency portion of said audio signal that is attenuated directly with said gain control signal over said predetermined portion of the range of values of said difference.

25. A high-frequency tone attenuator for headsets as recited in claim 24 wherein:

gain control circuit is further responsive to said gain control signal to increase said attenuation of said variable high frequency portion directly with said gain control signal over said predetermined portion of the range of values of said difference.

* * * * *